United States Patent
Haine

(10) Patent No.: US 10,637,404 B2
(45) Date of Patent: Apr. 28, 2020

(54) POWER AMPLIFIER APPARATUS, ENVELOPE TRACKING AMPLIFIER APPARATUS AND METHOD OF AMPLIFYING A SIGNAL

(71) Applicant: u-blox AG, Thalwil (CH)

(72) Inventor: John Haine, Cambridge (GB)

(73) Assignee: u-blox AG, Thalwil (CH)

( * ) Notice: Subject to any disclaimer, the term of this patent is extended or adjusted under 35 U.S.C. 154(b) by 0 days.

(21) Appl. No.: 15/778,749

(22) PCT Filed: Dec. 17, 2015

(86) PCT No.: PCT/EP2015/080367
§ 371 (c)(1),
(2) Date: May 24, 2018

(87) PCT Pub. No.: WO2017/102017
PCT Pub. Date: Jun. 22, 2017

(65) Prior Publication Data
US 2018/0358930 A1    Dec. 13, 2018

(51) Int. Cl.
*H03F 3/68* (2006.01)
*H03F 1/02* (2006.01)
(Continued)

(52) U.S. Cl.
CPC ............. *H03F 1/0288* (2013.01); *H03F 3/16* (2013.01); *H03F 3/189* (2013.01); *H03F 3/193* (2013.01);
(Continued)

(58) Field of Classification Search
CPC ........ H03F 1/0288; H03F 3/604; H03F 3/211; H03F 3/16; H03F 3/193; H03F 3/602; H03F 3/189; H03F 2203/21142; H03F 2200/102
(Continued)

(56) References Cited

U.S. PATENT DOCUMENTS 7,330,077 B2 * 2/2008 Arnborg ............... H03F 1/0277
330/136
8,045,939 B2 * 10/2011 Hellberg ............... H03F 1/0222
330/127
(Continued)

FOREIGN PATENT DOCUMENTS

EP          2945285 A1    11/2015
WO    WO-2008/013481 A1    1/2008
WO    WO-2015/055242 A1    4/2015

OTHER PUBLICATIONS

Gajadharsing J R et al.: "Analysis and design of a 200W LDMOS based doherty amplifier for 3G base stations" Microwave Symposium Digest, 2004 IEEE MTT-S International Fort Worth, TX, USA Jun. 6-11, 2004, Piscataway, NJ, USA, IEEE, vol. 2, Jun. 6, 2004 (Jun. 6, 2004), pp. 529-532.
(Continued)

Primary Examiner — Khanh V Nguyen
(74) Attorney, Agent, or Firm — Finnegan, Henderson, Farabow, Garrett & Dunner, LLP

(57) ABSTRACT

An amplifier apparatus (332) comprises a main linear amplifier sub-circuit (402) having a main driving signal input terminal (331) and a main amplifier output terminal (406). The apparatus also comprises an auxiliary linear amplifier sub-circuit (404) having an auxiliary driving signal input terminal (357) and an auxiliary amplifier output terminal (408). A combining network (410) is operably coupled between the main amplifier output terminal (406) and the auxiliary amplifier output terminal (408), the combining network (410) having a main-side terminal (424) and an auxiliary-side terminal (434). The main linear amplifier sub-circuit (402) is arranged to generate, when in use, a main amplified signal in response to a main driving signal applied at the main driving signal input terminal (331). The auxiliary linear amplifier sub-circuit (404) is arranged to generate, (Continued)

when in use, an impedance modifying signal at the auxiliary-side terminal (357) in response to an auxiliary driving signal and at substantially the same time as the main linear amplifier sub-circuit (402) generates the main amplified signal, the auxiliary linear amplifier sub-circuit (404) also being arranged to amplify substantially more than half of each wave cycle of the auxiliary driving signal.

20 Claims, 7 Drawing Sheets

(51) Int. Cl.
    *H03F 3/189*     (2006.01)
    *H03F 3/60*     (2006.01)
    *H03F 3/16*     (2006.01)
    *H03F 3/193*     (2006.01)
    *H03F 3/21*     (2006.01)

(52) U.S. Cl.
    CPC ............. *H03F 3/211* (2013.01); *H03F 3/602* (2013.01); *H03F 3/604* (2013.01); *H03F 2200/102* (2013.01); *H03F 2203/21142* (2013.01)

(58) Field of Classification Search
    USPC ......................................................... 330/295
    See application file for complete search history.

(56) References Cited

U.S. PATENT DOCUMENTS

| | | | |
|---|---|---|---|
| 9,166,537 B2* | 10/2015 | Schmidt | H03F 1/0277 |
| 2012/0176194 A1 | 7/2012 | Kim et al. | |
| 2015/0070094 A1 | 3/2015 | Pham | |
| 2017/0179898 A1* | 6/2017 | Hayes | H03G 3/007 |

OTHER PUBLICATIONS

Raab F H: "Efficiency of Doherty RF Power-Amplifier Systems", IEEE Transactions on Broadcasting, IEEE Servicecenter, Piscataway, NJ, US, vol. BC-33, No. 3, Jan. 1, 1987 (Jan. 1, 1987), pp. 77-83.
Thomas M . Hone et al.: "Controlling Active Load-Pull in a Dual-Input Inverse Load Modulated Doherty Architecture" IEEE Transactions on Microwave Theory and Techniques, vol. 60, No. 6, Jun. 2012.
PCT Notification of Recording of a Change (PCT/IB/306) for Application No. PCT/EP2015/080367 filed Dec. 17, 2015.
PCT Written Opinion of the International Searching Authority (PCT/ISA/237) for Application No. PCT/EP2015/080367 filed Dec. 17, 2015.

* cited by examiner

POWER AMPLIFIER APPARATUS, ENVELOPE TRACKING AMPLIFIER APPARATUS AND METHOD OF AMPLIFYING A SIGNAL

FIELD OF THE INVENTION

The present invention relates to a power amplifier apparatus of the type that, for example, comprises a main linear amplifier sub-circuit and an auxiliary linear amplifier sub-circuit. The present invention also relates to an envelope tracking amplifier apparatus of the type that, for example, follows changes in an envelope of an input signal. The present invention also relates to a method of amplifying a signal, the method being of the type that, for example, comprises providing a main linear amplifier sub-circuit and an auxiliary linear amplifier sub-circuit.

BACKGROUND OF THE INVENTION

Power amplifiers find many uses in the field of electrical and electronic engineering. For example, power amplifiers can be found in audio amplifier circuits, servo-motor controllers, and Radio Frequency (RF) systems, such as are used in relation to wireless digital communications.

In this respect, in many countries, multiple generations of wireless, for example cellular, communications systems presently operate side-by-side. For example, the so-called 4G, or Long Term Evolution (LTE), communications system that is the successor to existing 2G and 3G communications systems provides communications coverage over similar geographic regions. In common, these wireless communications systems comprise a network infrastructure and user equipment, which can for example be portable communications devices. Such communications devices typically receive and transmit signals through the same antenna or antennas. For the transmit signals, RF signals applied to an antenna are typically amplified by a power amplifier prior to application of the signals to the antenna.

However, designing a wireless modem that can achieve efficient power transfer from the power amplifier to the antenna is a challenge shared by communications devices across the generations of systems. In this respect, the RF power amplifier is designed to be connected to a standard load impedance, usually 50 ohms, and optimised to deliver a required power to this load with maximum efficiency. In imprecise terms, the power amplifier is said to be "matched" to 50 ohms. The 50 ohm value is typically selected as it is a universal interface impedance for RF test equipment. However, the term "matched" in this context is a misnomer in the conventional "matched impedance" sense.

For a number of reasons, including the need to support multiple generations of communications systems, most modems for cellular communications devices now have to operate over a wide frequency range. For example, in Europe an embedded LTE communications device may need to operate in licensed frequency bands from 700 MHz through to 2500 MHz, and the antenna has to be reasonably efficient over all the frequency bands within this range. As most applications are size-sensitive, the antenna also has to be quite small, compromising efficiency, especially for the frequency bands below 1 GHz, which are the most useful frequency bands for coverage. For mobile communications devices, particularly smartphones, the commonplace form factor of these devices is of assistance to device radio designers, due to the long dimension of the communications device being, at the lowest operating frequency, approximately a quarter of a wavelength. However, there is no "standard" form-factor and so Original Equipment Manufacturers (OEMs) are at liberty to try to design communications modules into their devices that occupy as little space as possible, often without much consideration for the antenna, which will have to be as small as possible.

In view to the limited consideration given to the antenna, a common approach to improving the performance of an electrically small antenna is by way of an antenna tuning unit. As an antenna is shortened, the impedance of the antenna at resonance becomes reactive, for example capacitive, and this reactance can be cancelled by adding an inductor. An antenna matching network can therefore be provided to modify the impedance presented to a 50 ohm signal source to which the antenna is coupled in order to present a resistive impedance of 50 ohms to the signal source, thereby enabling all available power from the signal source to be transferred to the antenna. All of the power delivered to the antenna will be radiated in the event that the antenna and the matching network are lossless, but of course inefficiencies typically exist.

In relation to the antenna matching network, it is desirable to make such circuits tuneable, so that they can be adjusted to optimise the power transfer from the signal source depending upon the band of operation being used and/or to adapt to other changes, for example antenna detuning caused by the proximity of a user's hand to the antenna. However, in practice available tuneable matching networks, typically switched capacitor networks, are accompanied by undesirable losses, which reduce overall efficiency of a transmitter path. Consequently, antenna tuning is mainly applied in respect of lower operating frequency bands, i.e. longer wavelengths, of a communications device in order to correct the impedance-related inefficiencies attributable to use of an antenna shorter than optimum length.

Furthermore, this approach may involve the use of two "matching" networks: a first network is employed to "match" the power amplifier to 50 ohms to interface to test equipment, and a second network is employed to transform the impedance of the antenna to 50 ohms.

Another known technique for influencing impedance employs so-called "active load-pull", which is applied for example in a type of power amplifier known as a Doherty amplifier. An example of the Doherty amplifier is described "Controlling Active Load-Pull in a Dual-Input Inverse Load Modulated Doherty Architecture" (Hone et al., IEEE Transactions on Microwave Theory and Techniques, Vol. 60, June 2012, pages 1797 to 1804). The Doherty type amplifier comprises a main power amplifier and an auxiliary (peaking) Class-C power amplifier combined such that at low power levels the auxiliary power amplifier is biased off, but at higher power levels, for example an input signal power from 6 dB below peak upwards, the auxiliary power amplifier starts to take over the supply of a "baseline" load with high efficiency whilst the main power amplifier amplifies in respect of the peak of the input signal.

Another aspect of wireless digital communications that requires consideration with respect to amplifier design is the high Peak-to-Average Power Ratios (PAPRs) sometimes possessed by modulated signals. In this respect, it is difficult to design an RF power amplifier for a communications device that can deliver high efficiency over a wide range of output powers, especially where the communications device is powered by a battery, which by its nature has limited available power, but where the actual transmit power required of the communications device varies over a wide range as dictated by the network infrastructure. Indeed, for spectrally efficient communications systems, for example those operating in accordance with the LTE standard and that employ an Single-Carrier Frequency Division Multiple Access (SC-FDMA) modulation scheme, the PAPR of a signal to be transmitted can be more than 10 dB depending on the bandwidth occupied by the signal and details of the modulation parameters selected from time to time. Where the signal has such a high PAPR, power amplifiers responsible for amplifying the signal to be transmitted conventionally have to operate at a large back-off when stringent linearity requirements must be satisfied. Whilst operating the power amplifier at relatively high output power back-off ensures the LTE signal is not greatly distorted when its envelope is near its peak, the efficiency of the power amplifier reduces with the increase in the amount of output power back-off applied.

One way to compensate for the low operational efficiency of the power amplifier due to the need to operate the power amplifier in the back-off region is to use so-called Envelope Tracking (ET), a technique that allows the supply voltage of the power amplifier to track the magnitude of an envelope of an RF drive signal applied to the power amplifier. In this regard, when the magnitude of the envelope of the RF drive signal is low, the supply voltage is reduced so that the power amplifier operates closer to an optimal efficiency point thereof. As such, a supply voltage to a transistor of a power amplifier is varied so that at every instant the transistor has only just enough voltage headroom for a desired power output, i.e. the transistor operates nearly in compression all the time.

However, envelope tracking places technical demands on the RF power amplifier circuit employed. Envelope tracking requires a modulator comprising a switched mode power supply for high efficiency, having an output voltage that can follow the envelope of the RF drive signal with a bandwidth several times that of the RF drive signal being amplified, for example for about 100 MHz for a 20 MHz LTE carrier signal. Additionally, to implement envelope tracking, the supply voltage of the RF power amplifier circuit has to drop a fixed supply voltage to a variable voltage value in response to an instantaneous envelope amplitude with reference to a tracking table. Furthermore, noise has to be minimised, because any noise, for example switching noise at the output of the modulator, appears directly as amplitude modulation of the carrier signal and increases out-of-band noise. In addition to exhibiting low noise and high efficiency, the modulator has to be provided at a low cost. The design and integration process for an envelope tracking power amplifier is therefore complex.

BRIEF SUMMARY OF THE INVENTION

According to a first aspect of the present invention, there is provided an amplifier apparatus comprising: a main linear amplifier sub-circuit having a main driving signal input terminal and a main amplifier output terminal; an auxiliary linear amplifier sub-circuit having an auxiliary driving signal input terminal and an auxiliary amplifier output terminal; a combining network operably coupled between the main amplifier output terminal and the auxiliary amplifier output terminal, the combining network having a main-side terminal and an auxiliary-side terminal; wherein the main linear amplifier sub-circuit is arranged to generate, when in use, a main amplified signal in response to a main driving signal applied at the main driving signal input terminal; and the auxiliary linear amplifier sub-circuit is arranged to generate, when in use, an impedance modifying signal at the auxiliary-side terminal in response to an auxiliary driving signal and at substantially the same time as the main linear amplifier sub-circuit generates the main amplified signal, the auxiliary linear amplifier sub-circuit also being arranged to amplify substantially more than half of each wave cycle of the auxiliary driving signal.

The auxiliary linear amplifier sub-circuit may be arranged to generate, when in use, the impedance modifying signal in response to the auxiliary driving signal being related to the main driving signal by a complex scaling factor so as to modify an impedance presented to the main linear amplifier sub-circuit, thereby maximising electrical power transfer from the main amplifier output terminal.

The impedance modifying signal may be generated to modify an impedance value at the auxiliary-side terminal in order to maintain a predetermined load impedance value presented to the main linear amplifier sub-circuit.

The main linear amplifier sub-circuit may be arranged as a Class A, Class B or a Class NB amplifier. The auxiliary linear amplifier sub-circuit may be arranged as a Class A, Class B or a Class NB amplifier.

The main linear amplifier sub-circuit and the auxiliary linear amplifier sub-circuit may both be respectively arranged as the same class of amplifier.

The combining network may be an admittance inverter. The admittance inverter may be a π-network of frequency invariant susceptances.

The main linear amplifier sub-circuit, the auxiliary linear amplifier sub-circuit and the combining network may be arranged as a Doherty amplifier structure.

The combining network may be a quadrature hybrid junction.

The apparatus may further comprise: a driving signal generator operably coupled to the auxiliary linear amplifier sub-circuit.

The driving signal generator may be arranged to generate the auxiliary driving signal by application of the complex scaling factor.

The application of the complex scaling factor may be a digital signal processing operation.

According to a second aspect of the present invention, there is provided a radio frequency processing resource comprising: an amplifier apparatus as claimed in set forth above in relation to the first aspect of the invention.

According to a third aspect of the present invention, there is provided a communications apparatus comprising: the radio frequency processing resource as set forth above in relation to the second aspect of the invention; and a load operably coupled to the auxiliary-side terminal of the combining network.

The impedance modifying signal applied at the auxiliary-side terminal may be arranged to modify an impedance value of the load with respect to the main linear amplifier sub-circuit, thereby maximising power transfer from the main linear amplifier sub-circuit into the load.

The load may comprise an antenna.

The apparatus may further comprise: a baseband processing resource comprising a main signal path and an auxiliary signal path; wherein the main signal path and the auxiliary signal path are respectively coupled to a common transmit signal source; and the complex scaling factor is applied in the auxiliary signal path.

The complex scaling factor, $\alpha$, is:

$$\alpha = -j\left(kZ_0 - \frac{Y_l}{k}\right),$$

where $Z_0$ is an impedance value of the load to be presented to the main linear amplifier sub-circuit, k is susceptance value of each individual susceptance of the π-network of frequency invariant susceptances, and $Y_l$ is an admittance value of the load.

According to a fourth aspect of the present invention, there is provided an envelope tracking amplifier apparatus comprising: the power amplifier apparatus as set forth above in relation to the first aspect of the invention; and an envelope response processor arranged to control bias of the main linear amplifier sub-circuit and to generate the complex scaling factor.

The envelope response processor may comprise: a bias shaper; and an impedance shaper.

The envelope response processor may comprise: an envelope detector arranged to generate, when in use, an envelope detection signal.

The bias shaper may be arranged to receive the envelope detection signal and to generate a bias network control signal in response to the envelope detection signal.

The main linear amplifier sub-circuit may comprise a bias network circuit; the bias network circuit may be operably coupled to the bias shaper.

The main linear amplifier sub-circuit may comprise a main drive circuit. The main drive circuit may comprise the bias network circuit.

The apparatus may further comprise: a signal scaling module; wherein the impedance shaper may be arranged to receive the envelope detection signal and to cooperate with the signal scaling module in order to generate the complex scaling factor in response to the envelope detection signal and knowledge of an impedance of the combining network.

The auxiliary linear amplifier sub-circuit may comprise an auxiliary drive circuit. The auxiliary drive circuit may be operably coupled to the driving signal generator.

According to a fifth aspect of the present invention, there is provided a power amplifier apparatus comprising the amplifier apparatus as set forth above in relation to the first aspect of the invention.

According to a sixth aspect of the present invention, there is provided a communications apparatus comprising the amplifier apparatus as set forth above in relation to the first aspect of the invention.

According to a seventh aspect of the present invention, there is provided a method of amplifying a main drive signal, the method comprising: providing a main amplifier sub-circuit having a main driving signal input terminal and a main amplifier output terminal; providing an auxiliary amplifier sub-circuit having an auxiliary driving signal input terminal and an auxiliary amplifier output terminal; operably coupling a combining network between the main amplifier output terminal and the auxiliary amplifier output terminal; applying the main driving signal to the main driving signal input terminal, the main linear amplifier sub-circuit generating a main amplified signal in response to the main driving signal; applying an auxiliary driving signal to the auxiliary driving signal input terminal, the auxiliary linear amplifier sub-circuit generating an impedance modifying signal in response to the auxiliary driving signal and at substantially the same time as the main linear amplifier sub-circuit; and the auxiliary linear amplifier sub-circuit amplifying substantially more than half of each wave cycle of the auxiliary driving signal.

According to an eighth aspect of the present invention, there is provided a An amplifier apparatus comprising: a main linear amplifier sub-circuit having a main driving signal input terminal and a main amplifier output terminal; an auxiliary linear amplifier sub-circuit having an auxiliary driving signal input terminal and an auxiliary amplifier output terminal; a combining network operably coupled between the main amplifier output terminal and the auxiliary amplifier output terminal, the combining network having a main-side terminal and an auxiliary-side terminal; wherein the main linear amplifier sub-circuit is arranged to generate, when in use, a main amplified signal in response to a main driving signal applied at the main driving signal input terminal; and the auxiliary linear amplifier sub-circuit is arranged to generate, when in use, an auxiliary amplified signal at the auxiliary-side terminal in response to an auxiliary driving signal that is related to the main driving signal by a complex scaling factor, thereby maximising electrical power transfer from the main amplifier output terminal.

According to a ninth aspect of the present invention, there is provided a method of driving an amplifier circuit, the method comprising: providing a main amplifier sub-circuit having a main driving signal input terminal and a main amplifier output terminal; providing an auxiliary amplifier sub-circuit having an auxiliary driving signal input terminal and an auxiliary amplifier output terminal; operably coupling a combining network between the main amplifier output terminal and the auxiliary amplifier output terminal; applying a main driving signal to the main driving signal input terminal; and applying an auxiliary driving signal to the auxiliary driving signal input terminal; wherein the auxiliary driving signal is related to the main driving signal by a complex scaling factor.

It is thus possible to provide an apparatus and method that enables optimum power transfer from an amplifier sub-circuit to a load, for example an antenna. The apparatus and method obviates the use of variable passive components to achieve optimum power transfer, thereby reducing power losses. Furthermore, adaptation to optimise power transfer can be applied in the digital domain, for example in a baseband integrated circuit.

BRIEF DESCRIPTION OF THE DRAWINGS

At least one embodiment of the invention will now be described, by way of example only, with reference to the accompanying drawings, in which.

DETAILED DESCRIPTION OF THE INVENTION

Figure 1:
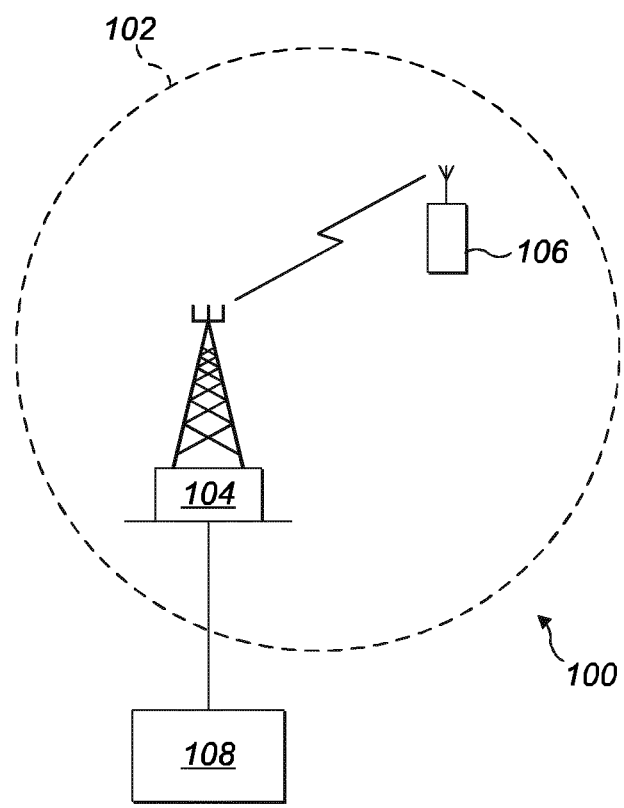
FIG. 1 is a schematic diagram of a user equipment unit operating in a part of a communications network.

Throughout the following description identical reference numerals will be used to identify like parts. For the avoidance of doubt, references herein to "linear amplifiers" should be understood to mean amplifiers operating in or arranged to operate in a linear mode of operation.

Referring to FIG. 1, in a wireless communications system, for example a Long Term Evolution (LTE) communications system 100, a communications network is supported by a plurality of cells arranged to provide wireless communications access over a geographic region. In this example, only a single cell is shown for the sake of simplicity and conciseness of description. However, the skilled person will appreciate that a greater number of cells is usually deployed throughout the communications network. In this respect, a cell 102 is supported by a base station, referred to as an evolved Node B (eNodeB) 104 in the context of the LTE communications system 100. The eNodeB 104 is capable of communicating wirelessly with a communications apparatus, for example a User Equipment (UE) unit 106, over an air interface. The eNodeB 104 is operably coupled to an Evolved Packet Core (EPC) 108. However, since the examples set forth herein concern the UE unit 106, for the sake of clarity and conciseness of description, further details of the wireless communications network infrastructure will not be described herein.

Figure 2:
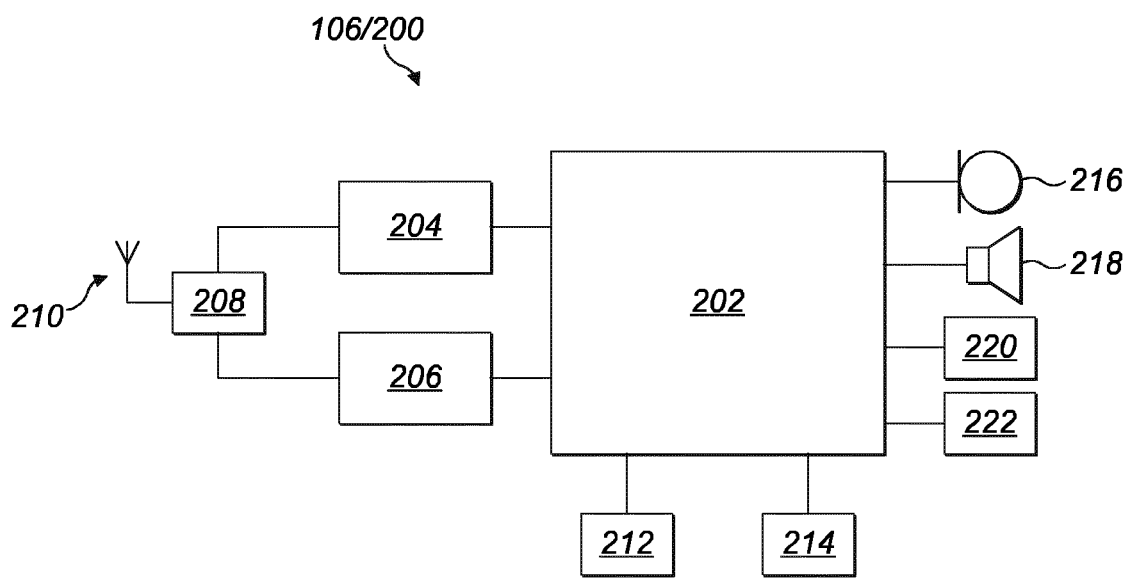
FIG. 2 is a schematic diagram of a user equipment device of FIG. 1.

Turning to FIG. 2, the user equipment (UE) device 106/200 operating in an LTE communications system, comprises a processing resource 202, the processing resource 202 being, in this example, a chipset of a cellular communications terminal. The processing resource 202 is coupled to a transceiver comprising a transmitter chain 204 and a receiver chain 206, the transmitter and receiver chains 204, 206 being coupled to a duplexing component 208, hereinafter referred to as a "duplexer" 208. The duplexer 208 is coupled to an antenna 210.

The UE unit 200 also possesses a volatile memory, for example a RAM 212, and a non-volatile memory, for example a digital memory 214, each coupled to the processing resource 202. The processing resource 202 is also coupled to a microphone 216, a speaker unit 218, a keypad 220 and a display 222. The skilled person should appreciate that the architecture of the UE unit 200 described above comprises other elements, for example multiple antennae, but such additional elements have not been described in detail herein for the sake of preserving conciseness and clarity of description.

The transmitter chain 204 and the receiver chain 206 are supported by a hardware subsystem. The transmitter chain 204 and the receiver chain 206 are part of a transceiver, which is part of a modem of the UE unit 200. The modem is configured to provide wireless network access, for example in accordance with the SC-FDMA uplink communications scheme, such as defined in the LTE standard. However, it should be appreciated that the examples set forth herein should not be construed as restricted to the communications systems and standards described. In the examples set forth herein, the term modem should be understood to embrace any suitable signal modulation and/or demodulation apparatus. The hardware subsystem is a collection of hardware and/or software elements that contributes, with other subsystems, to the transmitter chain 204 and/or a receiver chain 206.

Figure 3:
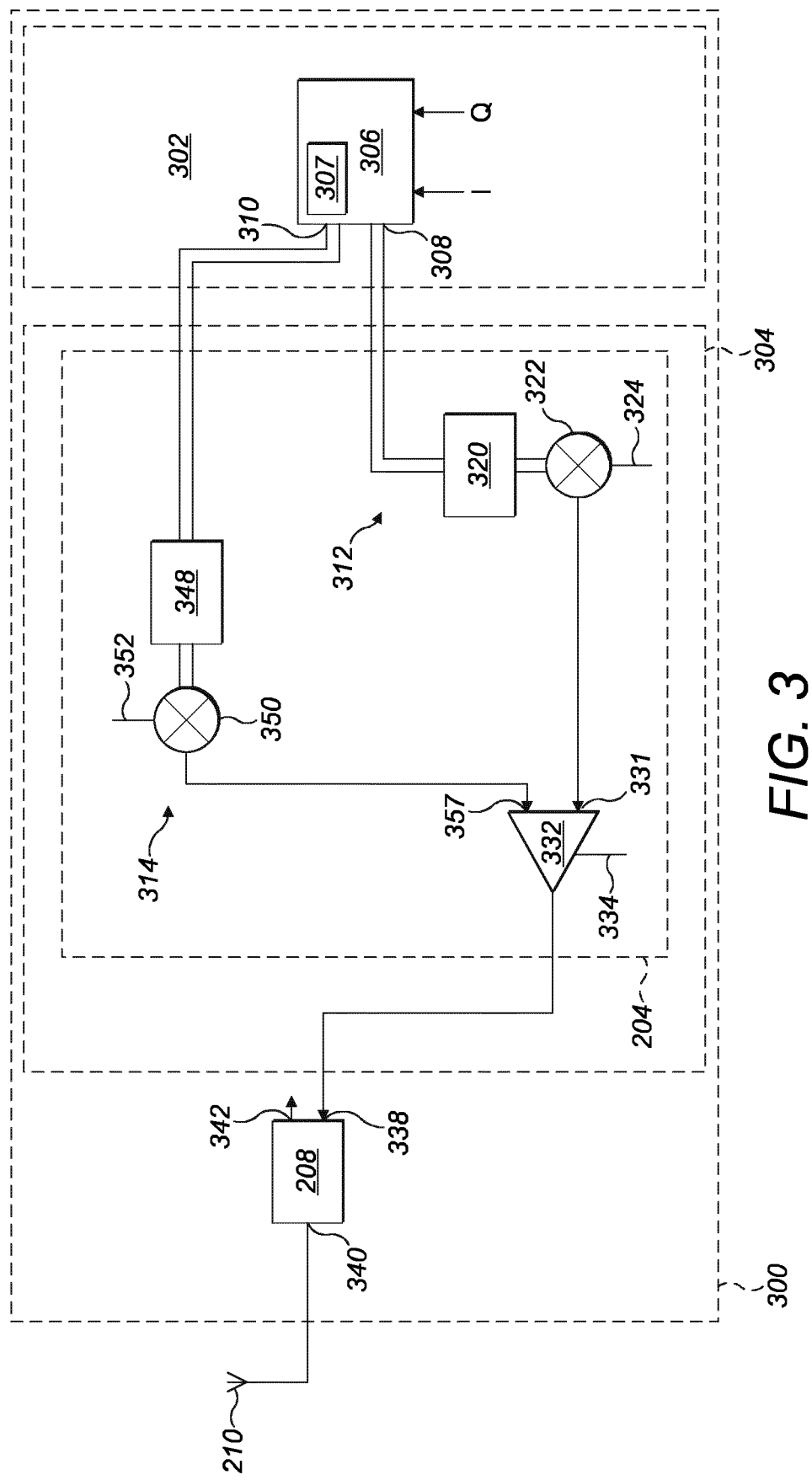
FIG. 3 is a schematic diagram of a part of a transceiver of the user equipment device of FIG. 1 in greater detail.

Referring to FIG. 3, the hardware subsystem 300, a part of which that is shown, is configured in accordance with the SC-FDMA communications scheme and comprises baseband processing components and Radio Frequency (RF) processing components, some or all of which can respectively be supported by a baseband Integrated Circuit (IC) 302 and a Radio Frequency (RF) IC 304. The RF processing components constitute an RF processing resource to support the transmitter chain 204 and the receiver chain 206. Although, in this example, two separate ICs are employed, namely the baseband IC 302 and the RF IC 304, the skilled person will appreciate that other implementations are possible in which the RF and baseband processing components are implemented as a single IC. The RF processing components comprise functional components arranged in stages. For the transmitter chain 204, the RF processing components are functional components that are arranged to modulate a received digital signal centred about a baseband range of frequencies, i.e. zero frequency, onto a carrier signal.

The baseband processing components comprise functional components arranged in stages. For the transmitter chain 204, the baseband processing components are arranged to process a signal in the baseband range of frequencies, prior to being translated to the analogue domain and up-converted onto a carrier frequency. In order to preserve conciseness, the description herein is confined to the transmitter chain 204, because the examples set forth herein do not concern the receiver chain 206.

Some of the baseband processing components support a driving signal generator 306 having in-phase (I) and quadrature (Q) signal inputs and a signal scaling module 307. In this, and other examples set forth herein, only a portion of the baseband processing is described, because other components of the baseband processing would be readily understood by the skilled person but have no bearing on the understanding of the inventive concepts expounded in the examples set forth herein. Consequently, such other components will not be described in further detail, and the examples contained herein are therefore only described in the context of I and Q signals already being generated by the baseband processing components, which are then subjected to further processing in order to support power amplification by the RF processing components.

A first output 308 of the driving signal generator 306 and a second output 310 of the driving signal generator 306 are coupled to a part of the transmitter chain 204 of the transceiver supported by the RF processing components. In this example, the transmitter chain 204 supports a main up-conversion chain 312 and an auxiliary up-conversion chain 314. In this respect, the first output 308 is operably coupled to the main up-conversion chain 312 and the second output 310 is operably coupled to the auxiliary up-conversion chain 314 so that main I and Q signal paths extend from the first output 308 to the main up-conversion chain 312 and auxiliary I and Q signal paths extend from the second output 310 to the auxiliary up-conversion chain 314, respectively.

Referring firstly to the main up-conversion chain 312, the first output 308 is operably coupled to an input of a main Digital-to-Analogue Converter (DAC) component 320, analogue I and Q outputs of the main DAC component 320 being operably coupled to I and Q transmit signal inputs of a main transmit signal mixer component 322. The main transmit signal mixer component 322 has a main two-phase transmit local oscillator input 324 for receiving a two-phase transmit local oscillator signal. An output of the main transmit signal mixer component 322 is operably coupled to a main input 331 of a power amplifier apparatus 332, further details of which will be described later herein. The power amplifier apparatus 332 is implemented as a part of the hardware subsystem and can be considered a component thereof. The skilled person will appreciate that the power amplifier component 332 need not necessarily be implemented as part of the RF IC 304 and can be provided separately to the parts of the transmitter chain supported by the RF IC 304, but coupled to the transmitter chain 204 at an appropriate point in the transmitter chain 204. An output of the power amplifier component 332 is operably coupled to a transmit side port 338 of the duplexer 208. An antenna side port 340 of the duplexer 208 is operably coupled to the antenna 210. A receive side port 342 of the duplexer 208 is operably coupled to the receiver chain 206, details of which will not be described further herein for reasons already explained above.

Turning to the auxiliary up-conversion chain 314, the second output 310 is operably coupled to an input of an auxiliary Digital-to-Analogue Converter (DAC) component 348, an output of the auxiliary DAC component 348 being operably coupled to I and Q auxiliary transmit signal inputs of an auxiliary transmit signal mixer component 350. The auxiliary transmit signal mixer component 350 has an auxiliary two-phase transmit local oscillator input 352 for receiving the (same) two-phase transmit local oscillator signal mentioned above. An output of the auxiliary transmit signal mixer component 350 is operably coupled to an auxiliary input 357 of the power amplifier component 332.

As shown in FIG. 3, the main and auxiliary I, Q signal paths extend from the driving signal generator 306 to the main and auxiliary transmit signal mixer components 322, 350 used for up-conversion to signals to be amplified by the power amplifier component 332. The skilled person will, of course, appreciate that the up-conversion can be implemented in a number of different ways, for example in stages.

It should be noted that both the main and auxiliary up-conversion chains 312, 314 may comprise additional analogue gain stages in order to achieve the required amplification. These gain stages can be controllable. Additionally, the skilled person will appreciate that the signal at different stages in the respective chain can be single ended or differential, depending on the chosen implementation.

Figure 4:
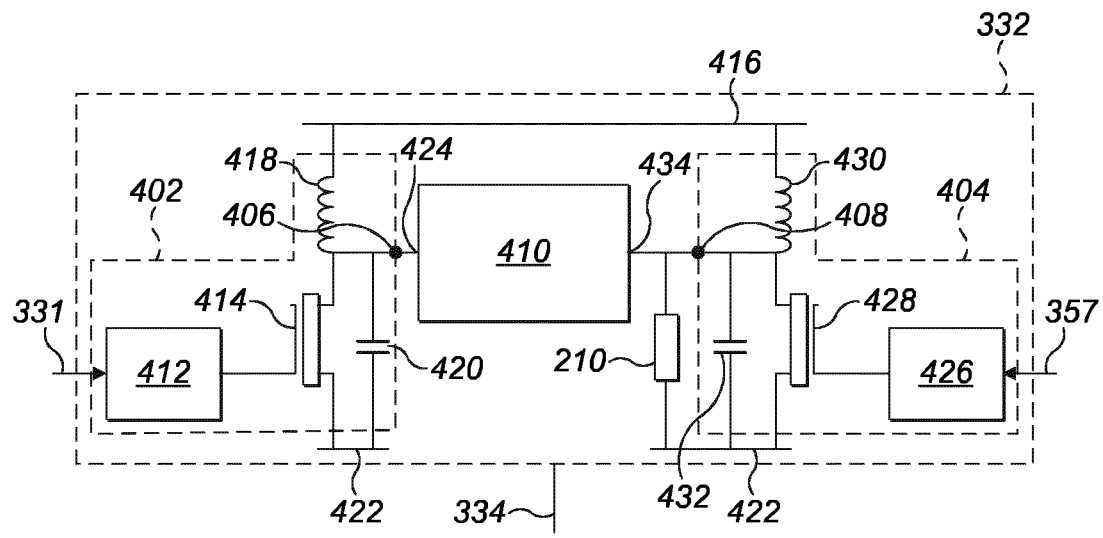
FIG. 4 is a schematic diagram of an amplifier apparatus of the transceiver of FIG. 3 and constituting an embodiment of the invention.

Referring to FIG. 4, which embraces support for generating an auxiliary drive signal in either the analogue or digital domain, the main input 331 of the power amplifier component 332 and the auxiliary input 357 of the power amplifier component 332 are respectively coupled to the output of the main transmit signal mixer component 322 and the output of the auxiliary transmit signal mixer component 350 as described above. In one embodiment, an RF signal source can be considered as being coupled to the main input 331 and the auxiliary input 357, but in respect of the auxiliary input 357 the output of the signal source is notionally subjected to complex scaling, a, before being applied at the auxiliary input. The processing components responsible for the application of the complex scaling factor, α, have been described above in relation to FIG. 3. In practice, the driving signal generator 306, without the signal scaling module 307, and the main up-conversion chain 312 constitute the signal source, whereas the driving signal generator 306, the signal scaling module 307 and the auxiliary up-conversion chain 314 provide the modified signal source. In the present example, the signal scaling module 307 is supported by the baseband processing components and hence calculation and application of the complex scaling factor is a digital signal processing operation. However, the skilled person will appreciate that in other implementations the complex scaling can be applied in the analogue domain.

The power amplifier component 332 comprises a main linear amplifier sub-circuit 402 having the main input 331 constituting a main driving signal input terminal. The power amplifier component 332 also comprises an auxiliary linear amplifier sub-circuit 404 having the auxiliary input 357 constituting an auxiliary driving signal input terminal. The main linear amplifier sub-circuit 402 also comprises a main amplifier output terminal 406 and the auxiliary linear amplifier sub-circuit 404 comprises an auxiliary amplifier output terminal 408. The power amplifier component 332 comprises a combining network 410 operably coupled between the main amplifier output terminal 406 and the auxiliary amplifier output terminal 408.

In this example, the main linear amplifier sub-circuit 402 comprises a main drive network 412 having an input operably coupled to the main input 331 and an output operably coupled to a main amplifying device, for example a main transistor, such as a main Field Effect Transistor (FET) 414. In this respect, the output of the main drive network 412 is coupled to a gate terminal of the main FET 414. A drain terminal of the main FET 414 is operably coupled to a supply rail 416 via a main inductance 418 coupled between the main amplifier output terminal 406 and the supply rail 416. A main capacitance 420 is coupled between the main amplifier output terminal 406 and ground potential 422. Together, the main inductance 418 and the main capacitance 420 constitute a main "tank" sub-circuit. One terminal of the main capacitance 420, one terminal of the main inductance 418 and the main amplifier output terminal 406 are therefore coupled to a main-side terminal 424 of the combining network 410. A source terminal of the main FET 414 is coupled to the ground potential 422. As the skilled person will appreciate, the main drive network 412 is arranged to configure parameters associated with the operation of the main FET 414, for example the class of the amplification, such as the operating point and the bias voltage, of the main FET 414. The main drive network 412 also serves to condition signals applied at the main input 331 in order to enable the main FET 414 to amplify the signals applied in a manner required by the application for the power amplifier component 332.

Similarly, the auxiliary linear amplifier sub-circuit 404 comprises an auxiliary drive network 426 having an input operably coupled to the auxiliary input 357 and an output operably coupled to an auxiliary amplifying device, for example an auxiliary transistor, such as an auxiliary FET 428. In this respect, the output of the auxiliary drive network 426 is coupled to a gate terminal of the auxiliary FET 428. A drain terminal of the auxiliary FET 428 is operably coupled to the supply rail 416 via an auxiliary inductance 430 coupled between the auxiliary amplifier output terminal 408 and the supply rail 416. A source terminal of the auxiliary FET 428 is coupled to the ground potential 422. An auxiliary capacitance 432 is coupled between the auxiliary amplifier output terminal 408 and the ground potential 422. Together, the auxiliary inductance 430 and the auxiliary capacitance 432 constitute an auxiliary "tank" sub-circuit. One terminal of the auxiliary capacitance 432, one terminal of the auxiliary inductance 430 and the auxiliary amplifier output terminal 408 are coupled to an auxiliary-side terminal 434 of the combining network 410. The antenna 210, constituting a load, is also operably coupled to the auxiliary-side terminal of the combining network 410. As the skilled person will appreciate, the auxiliary drive network 426 is arranged to configure parameters associated with the operation of the auxiliary FET 428, for example the class of the amplification, such as the operating point and the bias voltage, of the auxiliary FET 428. The auxiliary drive network 426 also serves to condition signals applied at the auxiliary input 357 in order to enable the auxiliary FET 428 to amplify the signals applied in a manner required by the application for the power amplifier component 332.

In the example above, the main linear amplifier sub-component 402 and the auxiliary linear amplifier sub-component 404 each respectively comprise an FET and are arranged as Class A amplifiers. However, the skilled person should appreciate that the main and auxiliary linear amplifier sub-components 402, 404 can each be respectively arranged as different classes of amplifiers, which do not have to be the same class of amplifier, although in the above example the amplifiers are of course of the same class. The main linear amplifier sub-component 402 can be arranged as a Class A, Class NB or Class B amplifier.

Similarly, the auxiliary amplifier sub-component 404 can be arranged as a Class A, Class NB or Class B amplifier. It should also be appreciated that although examples set forth herein employ field effect devices, other device technologies can be employed, for example bipolar transistors.

The skilled person will note that the structure of the amplifier apparatus 332 bears similarities to the so-called Doherty amplifier structure. However, as noted above the auxiliary amplifier sub-component is arranged, and driven, differently to the known Doherty amplifier, in particular in that it operates in a linear mode rather than Class-C.

For completeness, it should be noted that the power amplifier component also comprises an amplifier control input 334, which, in this example, is a bias control input for setting bias parameters of the main drive network 412 and the auxiliary drive network 426. In this respect, although not shown in FIG. 4, the main drive network comprises a bias network for biasing the main FET 414 and the auxiliary drive network 426 comprises another bias network for biasing the auxiliary FET 428. However, depending upon implementation preferences, the amplifier control input 334 can be used to communicate other control data to the amplifier component 332, additionally or alternatively, for example amplifier gain. In this example, the bias parameters do not vary, but in a later example the bias parameters are varied in response to an envelope of a signal.

Figure 5:
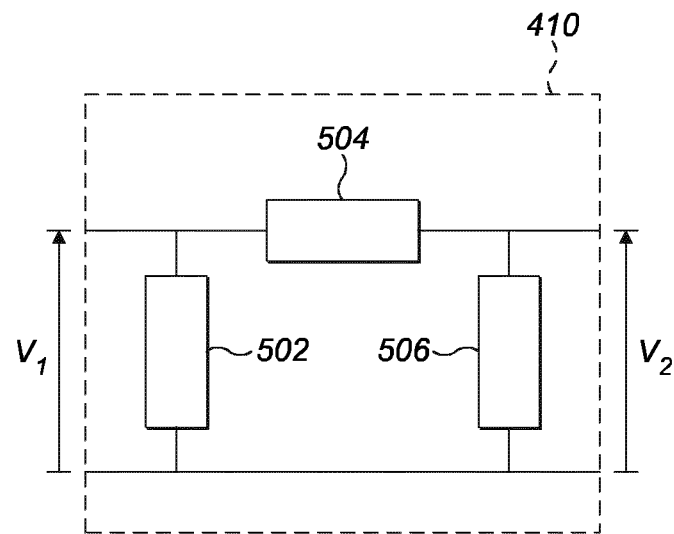
FIG. 5 is a schematic diagram of a combining network of the amplifier apparatus of FIG. 4.

Turning to FIG. 5, the combining network 410 is, in this example, an admittance inverter 500. The admittance inverter 410 is implemented as a π-network of frequency-invariant susceptances comprising a first susceptance 502, a second susceptance 504 and a third susceptance 506. The first and third susceptances are −jk in value, whereas the second susceptance is jk in value.

An admittance matrix, $Y_{inv}$, of the π-network of the combining network 410 can be expressed as:

$$Y_{inv} = \begin{pmatrix} 0 & -jk \\ -jk & 0 \end{pmatrix}$$

The admittance matrix is, however, modified to become an "augmented" admittance matrix, $Y_{aug}$, by virtue of the presence of the admittance, $Y_l$, of the load 210, which can be determined by measurement:

$$Y_{aug} = \begin{pmatrix} 0 & -jk \\ -jk & Y_l \end{pmatrix}$$

In order to be able to determine the influence of changes in voltage at the auxiliary-side terminal 434, an equivalent impedance matrix, $Z_{aug}$, can be written as follows, given the inverse relationship between admittance and impedance:

$$Z_{aug} = \frac{1}{k^2}\begin{pmatrix} Y_l & jk \\ jk & 0 \end{pmatrix}$$

The voltages at the ports of the combining network 410 can then be derived using Ohm's law:

$$\begin{pmatrix} v_1 \\ v_2 \end{pmatrix} = \frac{1}{k^2}\begin{pmatrix} Y_l & jk \\ jk & 0 \end{pmatrix}\begin{pmatrix} I \\ \alpha I \end{pmatrix}$$

This yields the following expressions for voltages at the ports:

$$v_1 = \frac{1}{k^2}(Y_l + jk\alpha)I$$

$$v_2 = \frac{1}{k^2}jkI = j\frac{I}{k}$$

Thus, the input impedance, $Z_1$, presented to the main linear amplifier sub-circuit 402 is:

$$Z_1 = \frac{1}{k^2}(Y_l + jk\alpha)$$

The impedance, $Z_2$, presented to the auxiliary linear amplifier sub-circuit 404 is:

$$Z_2 = \frac{j}{k}$$

As can be seen, the auxiliary linear amplifier sub-circuit 404 is presented with a fixed reactance, which is essentially the characteristic impedance of the combining network 410.

As the main linear amplifier sub-circuit 402 has to be presented with a load-line impedance, $Z_0$, for optimum power transfer to the load 210:

$$Z_0 = \frac{1}{k^2}(Y_l + jk\alpha)$$

Rearranging this expression, yields an expression for a complex scaling factor, α, that is used by the driving signal generator 306 to calculate the complex scaling factor, α, as required:

$$Z_0 - \frac{Y_l}{k^2} = \frac{j}{k}\alpha \qquad (1)$$

$$\alpha = -j\left(kZ_0 - \frac{Y_l}{k}\right)$$

Figure 6:
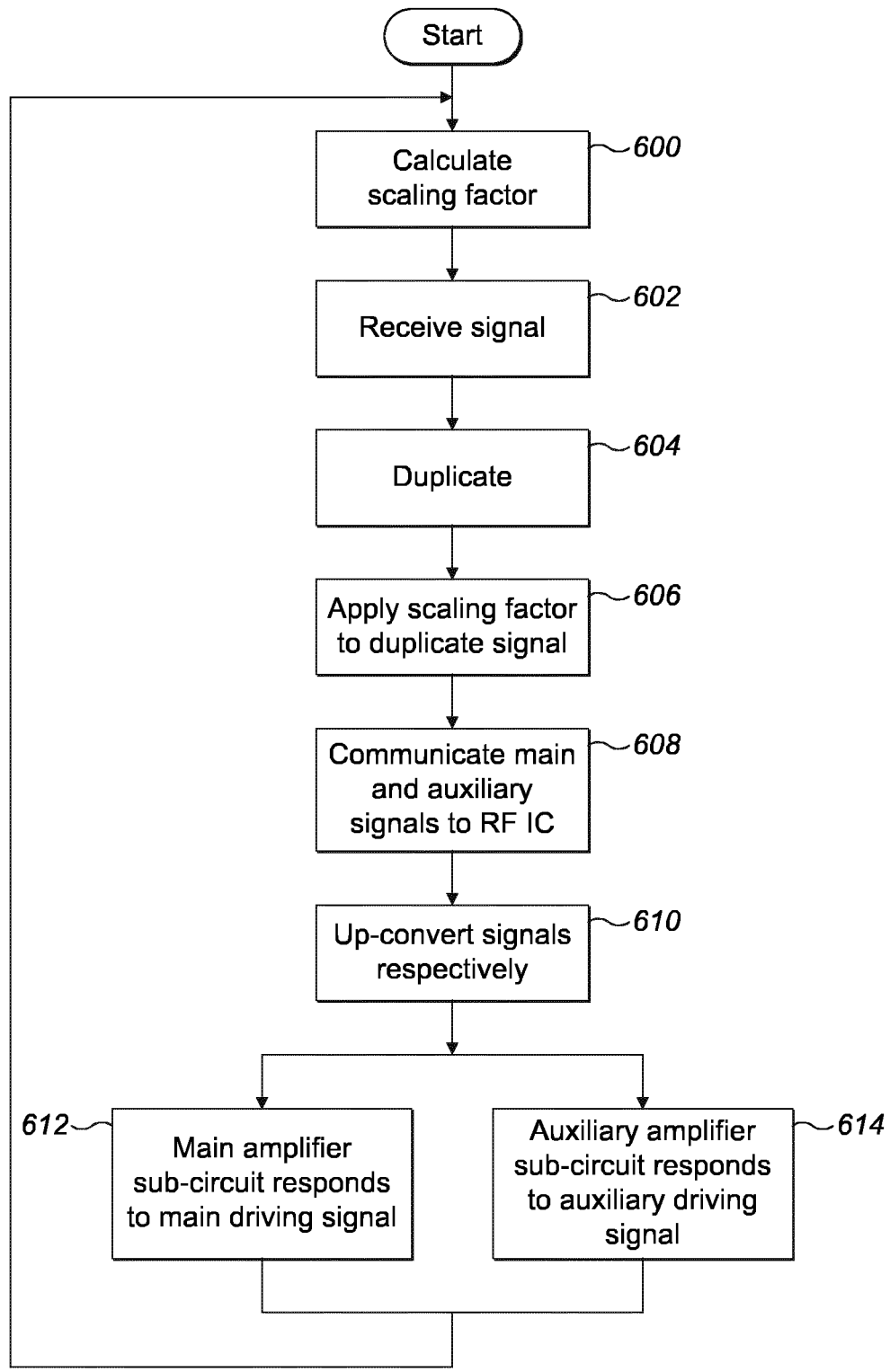
FIG. 6 is a flow diagram of a method of amplifying a signal constituting another embodiment of the invention.

In operation (FIG. 6), the driving signal generator 306 is pre-programmed with the predetermined impedance, $Z_O$, which needs to be presented to the main linear amplifier sub-circuit 402 in order for power transfer from the main linear amplifier sub-circuit 402 to the antenna 210 to be maximised, given the admittance, $Y_1$, of the antenna 210. Using this information, the signal scaling module 307 calculates (Step 600) the complex scaling factor, $\alpha$, using equation (1) derived above.

The driving signal generator 306 receives (Step 602) in-phase and quadrature phase components of a digital transmit signal intended for radiation by the antenna 210. For the sake of clarity and conciseness of description, the digital transmit signal is being assumed to have already been processed by the baseband processing components in all other necessary respects, as will be readily appreciated by the skilled person. The driving signal generator 306 duplicates (Step 604) the digital transmit signal so as, effectively, to provide a main signal path and an auxiliary signal path, respectively, the in-phase and quadrature phase components provided originating from a common transmit signal source within the baseband processing components, for example an output following completion of the other preceding baseband processing stages mentioned above. Using the complex scaling factor, $\alpha$, calculated above, the driving signal generator 306 applies (Step 606) the complex scaling factor, $\alpha$, to the duplicate of the I and Q components of the digital transmit signal in the digital domain, thereby scaling and phase shifting the duplicate digital transmit signal. Hereafter, the digital transmit signal and the duplicate thereof, as scaled, will be referred to as the main driving signal and the auxiliary driving signal, respectively.

The main and auxiliary driving signals are then output (Step 608) by the driving signal generator 306 to the RF processing components and, in particular, the main up-conversion chain 312 and the auxiliary up-conversion chain 314, respectively, where the main and auxiliary driving signals are up-converted (Step 610) prior to being applied, respectively, to the main input 331 and the auxiliary input 357 of the power amplifier component 332. For the sake of clarity and conciseness of description, as the skilled person is familiar with the operation of the structures of the main and auxiliary up-conversion chains 312, 314, operation of these components will not be described in further detail herein.

The main and auxiliary driving signals, now in the analogue domain, are as described above applied to the main and auxiliary linear amplifier sub-circuits 402, 404, respectively. The application of the main and auxiliary driving signals to the main and auxiliary linear amplifier sub-circuits 402, 404 is substantially simultaneous, resulting (Steps 612, 614) in the main FET 414 of the main amplifier sub-circuit 402 amplifying the main driving signal to yield a main amplified signal, and the auxiliary FET 428 of the auxiliary amplifier sub-circuit 404 amplifying the auxiliary driving signal, which is a scaled version of the main driving signal. As the auxiliary amplifier sub-circuit 404 is arranged as a linear amplifier, for example a Class A amplifier, the auxiliary amplifier sub-circuit 404 amplifies substantially more than half of each wave cycle of the auxiliary driving signal. In response to the auxiliary driving signal, the auxiliary linear amplifier sub-circuit 404 generates an impedance modifying signal at the auxiliary-side terminal 434 of the combining network 410, which in combination with the admittance, $Y_l$, of the antenna 210 presents the optimum impedance, $Z_O$, to the main linear amplifier sub-circuit 402 in accordance with equation (1) above. The impedance modifying signal effectively modifies the impedance presented to the main linear amplifier sub-circuit 402, thereby maximising electrical power transfer from the main output terminal 406 of the main linear amplifier sub-circuit 402. Hence, the efficiency with which electrical power is transferred to the antenna 210 is improved.

Referring back to FIG. 3, performance of the above amplifier apparatus 332 can be improved by implementing envelope tracking. In this example, the driving signal generator 306 is operably coupled to the amplifier apparatus 332 via the amplifier control input 334, which, in this example, is a bias control input. However, depending upon implementation preferences, the amplifier control input 334 can be used to communicate other control data to the amplifier component 332, additionally or alternatively, for example amplifier gain.

Figure 7:
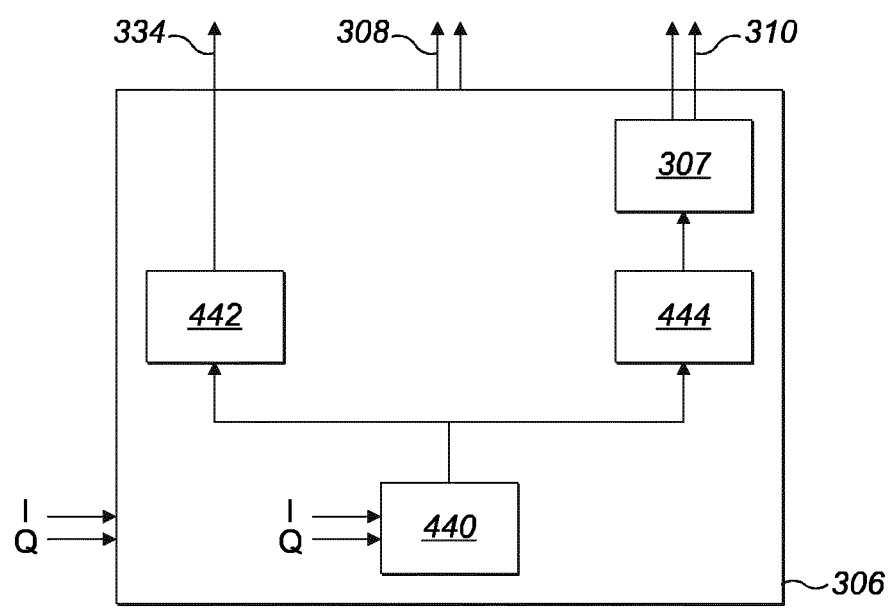
FIG. 7 is a schematic diagram of an alternative driving signal generator for use in combination with the amplifier apparatus of FIG. 4 for envelope tracking and constituting a further embodiment of the invention.

Turning to FIG. 7, in order to enable the power amplifier apparatus 332 to support so-called envelope tracking, in addition to the signal scaling module 307, the driving signal generator 306 comprises an envelope detector 440 operably coupled to the in-phase and quadrature inputs of the driving signal generator 306. An output of the envelope detector 440 is coupled to an input of a bias shaper 442 and an input of an impedance shaper 444. An output of the impedance shaper 444 is operably coupled to the signal scaling module 307. The envelope detector 440, the bias shaper 442 and the impedance shaper 444 together constitute an envelope response processor. The bias shaper 442 comprises predetermined bias shaping data, for example bias shaping table data, and the impedance shaper 444 comprises predetermined impedance shaping data, for example impedance shaping table data.

In this example, an output of the bias shaper 442 is operably to the main drive network 412 in order to programme the bias network of the main drive network 412.

Figure 8:
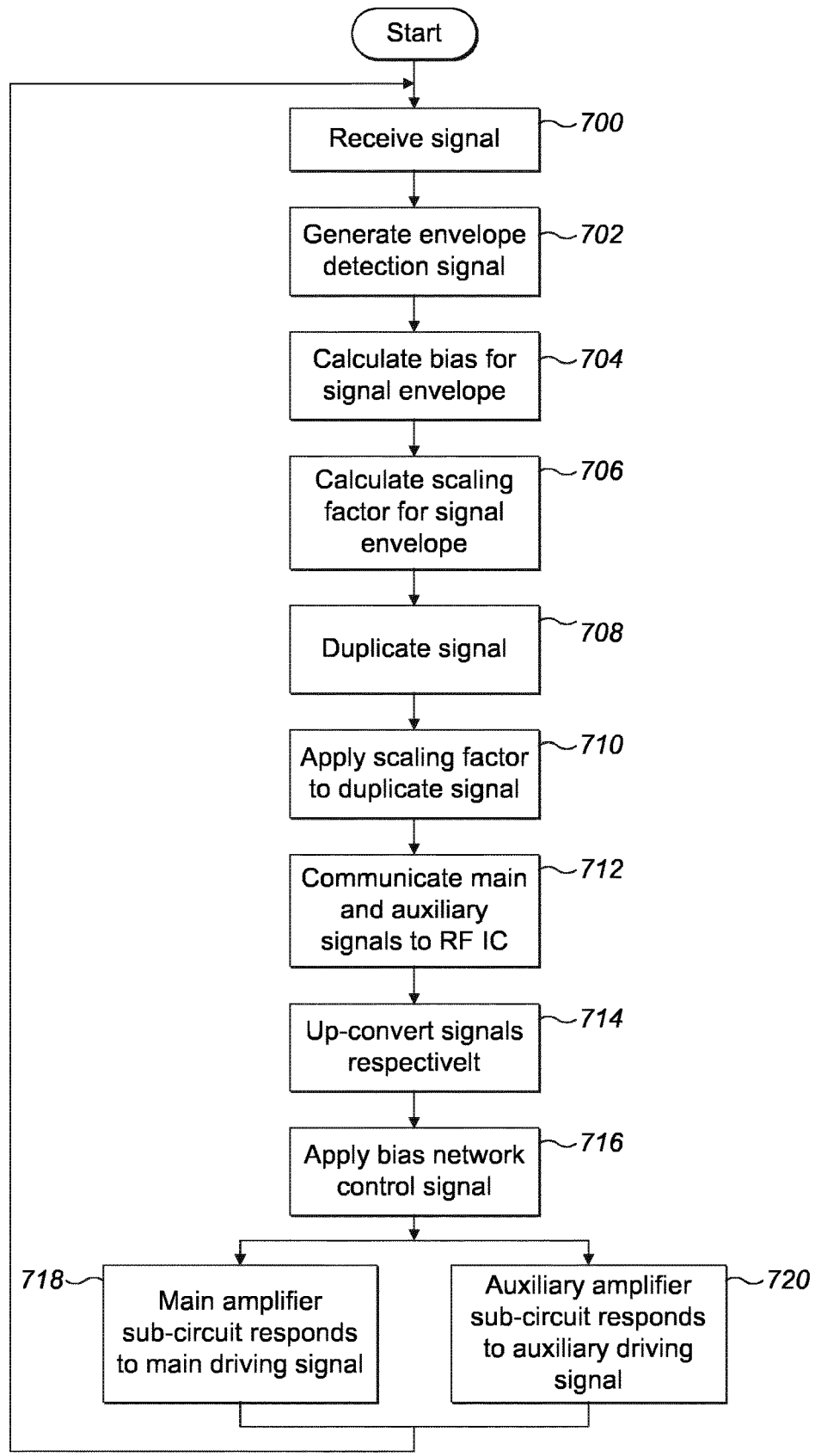
FIG. 8 is a flow diagram of another method of amplifying a signal constituting yet another embodiment of the invention.

In operation (FIG. 8), the driving signal generator 306 receives (Step 700) in-phase and quadrature phase components of a digital transmit signal from a common transmit signal source, constituting the primary signal source, within the baseband processing components, the digital transmit signal being intended for radiation by the antenna 210. For the sake of clarity and conciseness of description, the digital transmit signal is assumed to have already been processed by the baseband processing components in all other necessary respects, as will be readily appreciated by the skilled person. The envelope detector 440 generates (Step 702) an envelope detection signal in response to the in-phase and quadrature signal components using any suitable known technique, for example by squaring, summing and smoothing the in-phase and quadrature components. The envelope detected signal, which is a measure of the envelope of the digital transmit signal, is communicated to the bias shaper 442 and the impedance shaper 444.

In order to perform envelope tracking, in this example, the supply voltage to the main linear amplifier sub-circuit 402 is set at a fixed maximum supply voltage value. In order to achieve variation in power supplied to the load 210, the load-line impedance is modified using the complex scaling factor, $\alpha$, to modify the auxiliary driving signal, which is set by the signal scaling module 307. However, it is necessary to ensure that the voltage swing at the drain of the main FET 414, and hence the main amplifier output terminal 406, ranges between the operating threshold of the device and up to approximately twice the supply voltage value for all power levels supported. As the skilled person will appreciate, this can be achieved by, for example, setting the biases of the main FET 414 to track the detected envelope. The changes in biases are provided by the bias network of the main drive network 412. It should be noted that the required biases are amplifier implementation dependent and they can be stored in the previously mentioned bias shaping table. The skilled person will appreciate that the main drive network 412 can also be used to set the operating point of the main FET 414.

Consequently, the bias shaper 442 employs the pre-stored bias shaping table data to generate (Step 704) a bias network control signal to achieve the desired device bias current. The impedance shaper 444 is responsive to the measure of the envelope and uses the pre-stored impedance shaping table data and cooperates with the signal scaling module 307 in order to generate (Step 706) a complex scaling factor, α, to be applied to generate the auxiliary driving signal. In this respect, the impedance shaping data is derived from equation (1) above, where the predetermined impedance, $Z_0$, is assumed to vary depending upon a desired power level.

The driving signal generator 306 duplicates (Step 708) the digital transmit signal. Using the complex scaling factor, α, calculated above, the signal scaling module 307 of the driving signal generator 306 applies (Step 710) the complex scaling factor, α, to the I and Q components of the duplicate of the digital transmit signal, thereby scaling the duplicate digital transmit signal. Hereafter, the digital transmit signal and the duplicate thereof, as scaled, will be referred to as the main driving signal and the auxiliary driving signal, respectively.

The main and auxiliary driving signals are then output (Step 712) by the driving signal generator 306 to the RF processing components and, in particular, the main up-conversion chain 312 and the auxiliary up-conversion chain 314, respectively, where the main and auxiliary driving signals are up-converted (Step 714) prior to being applied, respectively, to the main input 331 and the auxiliary input 357 of the power amplifier component 332. For the sake of clarity and conciseness of description, as the skilled person is familiar with the operation of the structures of the main and auxiliary up-conversion chains 312, 314, operation of these components will not be described in further detail herein.

The bias network control signal generated above is also synchronously applied (Step 716) to the bias network of the main linear amplifier sub-circuit 412. The main and auxiliary driving signals, now in the analogue domain, are as described above applied to the main and auxiliary linear amplifier sub-circuits 402, 404, respectively. The application of the main and auxiliary driving signals to the main and auxiliary linear amplifier sub-circuits 402, 404 is substantially simultaneous, resulting (Steps 718, 720) in the main FET 414 of the main amplifier sub-circuit 402 amplifying the main driving signal to yield an amplified signal and the auxiliary FET 428 of the auxiliary amplifier sub-circuit 404 amplifying the auxiliary driving signal, which is a scaled version of the main driving signal. However, the bias voltage of the main linear amplifier sub-circuit 402 is modified by the bias network control signal, which modifies the bias current of the main FET 414 in substantial synchronism with the envelope. As such, and as indicated above, the voltage swing at the drain terminal of the main FET 414 remains constant, but the device is operating near its threshold. The power delivered to the antenna 210 is however varied by changing the impedance presented to the main linear amplifier sub-circuit 402.

In this respect, as the auxiliary amplifier sub-circuit 404 is arranged as a linear amplifier, for example a Class A amplifier, the auxiliary amplifier sub-circuit 404 amplifies substantially more than half of each wave cycle of the auxiliary driving signal. In response to the auxiliary driving signal, the auxiliary linear amplifier sub-circuit 404 generates the impedance modifying signal at the auxiliary-side terminal 434 of the combining network 410, which in combination with the admittance, $Y_j$, of the antenna 210 presents a desired impedance to the main linear amplifier sub-circuit 402 in accordance with the content of the impedance shaping data. The impedance modifying signal effectively modifies the impedance presented to the main linear amplifier sub-circuit 402 in synchronism with changes in the envelope, thereby optimising electrical power transfer at the desired level from the main output terminal 406 of the main linear amplifier sub-circuit 402. Hence, the efficiency with which electrical power is transferred to the antenna 210 is improved. The above processing steps (Steps 700 to 720) are repeated so that power usage by the main amplifier sub-circuit 402 tracks the envelope of the signal to be amplified and radiated.

Figure 9:
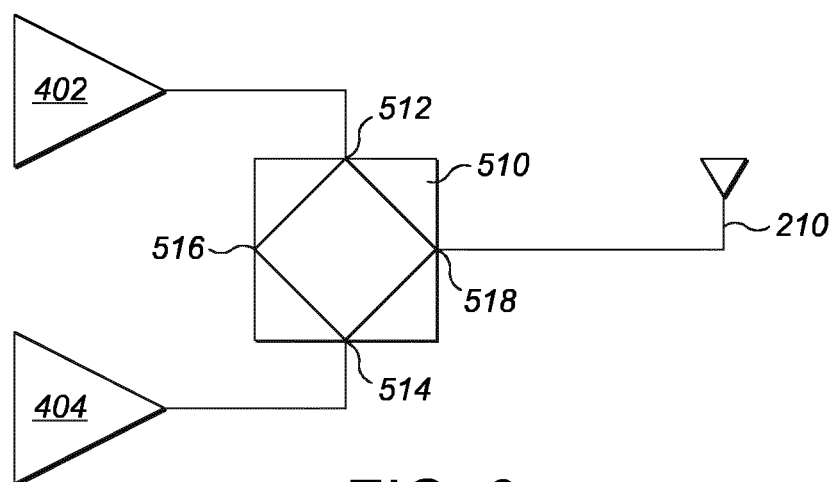
FIG. 9 is a schematic diagram of a combining network formed from a quadrature hybrid junction and constituting a further embodiment of the invention.

In another example, the combining network 410 can be formed using a quadrature hybrid junction. Referring to FIG. 9, a quadrature hybrid junction 510 comprises a first port 512, a second port 514, a third port 516 and a fourth port 518. The first and second ports 512, 514 constitute a first conjugate port pair, and the third and fourth ports 516, 518 constitute a second conjugate port pair. The skilled person will appreciate that if all the ports of the hybrid quadrature junction are matched, a signal incident upon a port is isolated from the conjugate port and equally divided in phase-quadrature between the other two ports. Quadrature hybrid junctions can be made, for example, using coupled transmission line structures or lumped element networks. In the present example, the output of the main linear amplifier sub-circuit 402 is applied to the first port 512 and the output of the auxiliary linear amplifier sub-circuit 404 is applied to the second port 514. The third port 516 is left open-circuit and the fourth port 518 is coupled to the antenna 210. It can be shown, for example by applying standard impedance matrix calculation methods, that an expression for the scaling factor, α, can be derived to set the impedance seen by the main linear amplifier sub-circuit 402 to the required load-line impedance, $Z_0$:

$$\alpha = j\left(\frac{Z_0}{Z_c} - 2Z_c Y_L\right)$$

where $Y_L$ is the load admittance of the antenna 210 and $Z_C$ is the characteristic impedance of the hybrid junction 510.

The skilled person should appreciate that the above-described implementations are merely examples of the various implementations that are conceivable within the scope of the appended claims. Indeed, throughout the above description, reference has been made to the application of the complex scaling factor in the digital domain. However, as indicated above, the complex scaling factor can be applied in the analogue domain. The skilled person will also appreciate that the architectures described above are in simplified form and the circuit configurations shown and described can, and usually do, employ other components and techniques for a desired amplification application. However, the components and techniques required would be readily understood by the skilled person, but since they have no bearing on the understanding of the inventive concepts expounded in the examples set forth herein, such components have not been described in further detail for the sake of clarity and conciseness.

The application of the amplifier apparatus and associated method should not be considered as being limited to the communications apparatus and the skilled person should appreciate that the amplifier apparatus and/or associated method can be used for any other suitable amplification application. Indeed, although the above examples have been described in the context of the 3GPP LTE communications standard, and in particular SC-FDMA modulation scheme, the skilled person will appreciate that the amplifier apparatus and associated method find application in relation to many other communications apparatus, schemes and standards, for example in relation to other cellular communications standards, short range wireless connectivity standards, such as the Wi-Fi® standard, and broadcast transmitters.

The systems and methods of the above embodiments may be implemented in a computer system (in particular in computer hardware) or in specifically manufactured or adapted integrated circuits, in addition to the structural components and user interactions described.

The term "computer readable media" includes, without limitation, any medium or media which can be read and accessed directly by a computer or computer system. The media can include, but are not limited to, magnetic storage media such as floppy discs, hard disc storage media and magnetic tape; optical storage media such as optical discs or CD-ROMs; electrical storage media such as memory, including RAM, ROM and flash memory; and hybrids and combinations of the above such as magnetic/optical storage media.

While specific examples of the invention have been described above, the skilled person will appreciate that many equivalent modifications and variations are possible. Accordingly, the exemplary embodiments of the invention set forth above are considered to be illustrative and not limiting. Various changes to the described embodiments may be made without departing from the spirit and scope of the invention.

The invention claimed is:

1. An amplifier apparatus comprising:
a main linear amplifier sub-circuit having a main driving signal input terminal and a main amplifier output terminal;
an auxiliary linear amplifier sub-circuit having an auxiliary driving signal input terminal and an auxiliary amplifier output terminal;
a combining network operably coupled between the main amplifier output terminal and the auxiliary amplifier output terminal, the combining network having a main-side terminal and an auxiliary-side terminal; wherein
the main linear amplifier sub-circuit is arranged to generate, when in use, a main amplified signal in response to a main driving signal applied at the main driving signal input terminal; and
the auxiliary linear amplifier sub-circuit is arranged to generate, when in use, an impedance modifying signal at the auxiliary-side terminal in response to an auxiliary driving signal and at substantially the same time as the main linear amplifier sub-circuit generates the main amplified signal, the auxiliary linear amplifier sub-circuit also being arranged to amplify substantially more than half of each wave cycle of the auxiliary driving signal.

2. The apparatus according to claim 1, wherein the auxiliary linear amplifier sub-circuit is arranged to generate, when in use, the impedance modifying signal in response to the auxiliary driving signal being related to the main driving signal by a complex scaling factor so as to modify an impedance presented to the main linear amplifier sub-circuit, thereby maximising electrical power transfer from the main amplifier output terminal.

3. The apparatus according to claim 1, wherein the impedance modifying signal is generated to modify an impedance value at the auxiliary-side terminal in order to maintain a predetermined load impedance value presented to the main linear amplifier sub-circuit.

4. The apparatus according to claim 1, wherein the combining network is an admittance inverter.

5. The apparatus according to claim 4, wherein the admittance inverter is a π-network of frequency invariant susceptances.

6. The apparatus according to claim 1, wherein the combining network is a quadrature hybrid junction.

7. The apparatus according to claim 1, further comprising:
a driving signal generator operably coupled to the auxiliary linear amplifier sub-circuit.

8. The apparatus according to claim 7, when dependent upon claim 2, wherein the driving signal generator is arranged to generate the auxiliary driving signal by application of the complex scaling factor.

9. The apparatus according to claim 8, wherein the application of the complex scaling factor is a digital signal processing operation.

10. A radio frequency processing resource comprising:
an amplifier apparatus according to claim 1.

11. A communications apparatus comprising:
the radio frequency processing resource according to claim 10; and
a load operably coupled to the auxiliary-side terminal of the combining network.

12. The apparatus according to claim 11, wherein the impedance modifying signal applied at the auxiliary-side terminal is arranged to modify an impedance value of the load with respect to the main linear amplifier sub-circuit, thereby maximising power transfer from the main linear amplifier sub-circuit into the load.

13. A communications apparatus comprising:
a radio frequency processing resource, the radio frequency processing resource comprising an amplifier apparatus according to claim 2;
a load operably coupled to the auxiliary-side terminal of the combining network;
a baseband processing resource comprising a main signal path and an auxiliary signal path; wherein
the main signal path and the auxiliary signal path are respectively coupled to a common transmit signal source; and
the complex scaling factor is applied in the auxiliary signal path.

14. A communications apparatus comprising:
a radio frequency processing resource, the radio frequency processing resource comprising an amplifier apparatus according to claim 2;
a load operably coupled to the auxiliary-side terminal of the combining network; wherein
the complex scaling factor, α, is:

$$\alpha = -j\left(kZ_0 - \frac{Y_l}{k}\right)$$

where $Z_0$ is an impedance value of the load to be presented to the main linear amplifier sub-circuit, k is susceptance value of each individual susceptance of the π-network of frequency invariant susceptances, and $Y_l$ is an admittance value of the load.

15. An envelope tracking amplifier apparatus comprising:
the power amplifier apparatus according to claim 8; and
an envelope response processor arranged to control bias of the main linear amplifier sub-circuit and to generate the complex scaling factor.

16. The apparatus according to claim 15, wherein the envelope response processor comprises:
a bias shaper; and
an impedance shaper.

17. The apparatus according to claim 16, wherein the envelope response processor comprises:
an envelope detector arranged to generate, when in use, an envelope detection signal; and
the bias shaper is arranged to receive the envelope detection signal and to generate a bias network control signal in response to the envelope detection signal.

18. The apparatus according to claim 17, wherein the main linear amplifier sub-circuit comprises a bias network circuit, the bias network circuit being operably coupled to the bias shaper.

19. The apparatus according to claim 16, wherein the envelope response processor comprises:
an envelope detector arranged to generate, when in use, an envelope detection signal, the apparatus further comprising:
a signal scaling module; wherein
the impedance shaper is arranged to receive the envelope detection signal and to cooperate with the signal scaling module in order to generate the complex scaling factor in response to the envelope detection signal and knowledge of an impedance of the combining network.

20. A method of amplifying a main drive signal, the method comprising:
providing a main amplifier sub-circuit having a main driving signal input terminal and a main amplifier output terminal;
providing an auxiliary amplifier sub-circuit having an auxiliary driving signal input terminal and an auxiliary amplifier output terminal;
operably coupling a combining network between the main amplifier output terminal and the auxiliary amplifier output terminal;
applying the main driving signal to the main driving signal input terminal, the main linear amplifier sub-circuit generating a main amplified signal in response to the main driving signal;
applying an auxiliary driving signal to the auxiliary driving signal input terminal, the auxiliary linear amplifier sub-circuit generating an impedance modifying signal in response to the auxiliary driving signal and at substantially the same time as the main linear amplifier sub-circuit; and
the auxiliary linear amplifier sub-circuit amplifying substantially more than half of each wave cycle of the auxiliary driving signal.

* * * * *